(12) United States Patent
Kim et al.

(10) Patent No.: US 11,990,565 B2
(45) Date of Patent: May 21, 2024

(54) DISPLAY DEVICE USING SEMICONDUCTOR LIGHT-EMITTING DIODES

(71) Applicant: LG ELECTRONICS INC., Seoul (KR)

(72) Inventors: Jungsub Kim, Seoul (KR); Sunghyun Moon, Seoul (KR); Younghak Chang, Seoul (KR); Jina Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 631 days.

(21) Appl. No.: 17/266,406

(22) PCT Filed: Aug. 29, 2018

(86) PCT No.: PCT/KR2018/009958
§ 371 (c)(1),
(2) Date: Feb. 5, 2021

(87) PCT Pub. No.: WO2020/032313
PCT Pub. Date: Feb. 13, 2020

(65) Prior Publication Data
US 2021/0313490 A1 Oct. 7, 2021

(30) Foreign Application Priority Data
Aug. 6, 2018 (KR) .................. 10-2018-0091461

(51) Int. Cl.
*H01L 21/78* (2006.01)
*H01L 25/075* (2006.01)
(Continued)

(52) U.S. Cl.
CPC .......... *H01L 33/38* (2013.01); *H01L 21/7806* (2013.01); *H01L 25/0753* (2013.01);
(Continued)

(58) Field of Classification Search
CPC ....... H01L 33/22; H01L 33/346; H01L 33/58; H01L 33/16; H01L 33/18; H01L 21/76254; H01L 21/76259
See application file for complete search history.

(56) References Cited

U.S. PATENT DOCUMENTS 6,326,280 B1 * 12/2001 Tayanaka .......... H01L 21/76251
257/E21.216
6,603,147 B1 8/2003 Hashimoto et al.
(Continued)

FOREIGN PATENT DOCUMENTS

CN 102315346 A 1/2012
CN 102315349 A 1/2012
(Continued)

*Primary Examiner* — Bradley Smith
*Assistant Examiner* — William Henry Anderson
(74) *Attorney, Agent, or Firm* — Birch, Stewart, Kolasch & Birch, LLP

(57) ABSTRACT

Discussed is a display device having a plurality of semiconductor light-emitting diodes. At least one of the semiconductor light-emitting diodes has a first conductive electrode and a second conductive electrode; a first conductive semiconductor layer on which the first conductive electrode is disposed; a second conductive semiconductor layer that overlaps with the first conductive semiconductor layer, and the second conductive electrode being disposed on the second conductive semiconductor layer; an active layer disposed between the first conductive semiconductor layer and the second conductive semiconductor layer; an undoped semiconductor layer disposed on the second conductive semiconductor layer; and protrusions formed of a porous material allowing electropolishing, and on the undoped semiconductor layer.

19 Claims, 18 Drawing Sheets

(51) Int. Cl.
*H01L 33/38* (2010.01)
*H01L 33/40* (2010.01)
*H01L 33/44* (2010.01)

(52) U.S. Cl.
CPC .............. *H01L 33/40* (2013.01); *H01L 33/44* (2013.01); *H01L 2933/0016* (2013.01); *H01L 2933/0025* (2013.01)

(56) References Cited

U.S. PATENT DOCUMENTS

| | | |
|---|---|---|
| 2007/0166851 A1 | 7/2007 | Tran et al. |
| 2007/0295952 A1* | 12/2007 | Jang .................. H01L 33/44 257/E33.068 |
| 2008/0273562 A1* | 11/2008 | Hasegawa ........... H01S 5/04254 372/44.01 |
| 2011/0233558 A1 | 9/2011 | Lee |
| 2012/0001219 A1 | 1/2012 | Park |
| 2012/0007100 A1 | 1/2012 | Jung et al. |
| 2013/0320386 A1 | 12/2013 | Schubert et al. |
| 2015/0179876 A1 | 6/2015 | Hu et al. |
| 2017/0288087 A1* | 10/2017 | Schubert ............... H01L 33/007 |
| 2018/0138357 A1* | 5/2018 | Henley ................ H01L 33/0075 |
| 2018/0219133 A1 | 8/2018 | Park et al. |
| 2018/0329212 A1* | 11/2018 | Aiki ...................... H01L 27/156 |

FOREIGN PATENT DOCUMENTS

| | | |
|---|---|---|
| CN | 108352429 A | 7/2018 |
| EP | 1 063 710 A1 | 12/2000 |
| KR | 2001-0007215 A | 1/2001 |
| KR | 10-2015-0089548 A | 8/2015 |
| KR | 10-2017-0024534 A | 3/2017 |
| KR | 10-2017-0079930 A | 7/2017 |

* cited by examiner

DISPLAY DEVICE USING SEMICONDUCTOR LIGHT-EMITTING DIODES

CROSS REFERENCE TO RELATED APPLICATIONS

This application is the National Stage filing under 35 U.S.C. 371 of International Application No. PCT/KR2018/009958, filed on Aug. 29, 2018, which claims the benefit of earlier filing date and right of priority to Korean Application No. 10-2018-0091461, filed on Aug. 6, 2018 in the Republic of Korea, the contents of all these applications being hereby incorporated by reference into the present application.

BACKGROUND

1. Technical Field

The present disclosure relates to a display device, and more particularly, to a display device using semiconductor light-emitting diodes.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light-emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light-emitting diodes (LEDs) are well known light-emitting diodes for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting diodes may be used to implement a display, thereby presenting a scheme for solving the problems.

When the semiconductor light-emitting diodes are transferred, the semiconductor light-emitting diodes due to heat or chemicals may be damaged. In addition, there is a disadvantage in that process cost is increased due to high facility cost, thereby increasing manufacturing cost. Accordingly, the present disclosure discloses a display device structure capable of preventing a semiconductor light-emitting diode from being damaged and reducing manufacturing cost when the semiconductor light-emitting diode is separated from a growth substrate.

SUMMARY

An aspect of the present disclosure is to provide a display device capable of preventing a semiconductor light-emitting diode from being damaged due to heat or chemicals, and reducing manufacturing cost during a process of separating the semiconductor light-emitting diode from a growth substrate.

Another aspect of the present disclosure is to provide a display device having a semiconductor light-emitting diode with reduced surface leakage current, and a manufacturing method thereof.

A display device according to the present disclosure may include a plurality of semiconductor light-emitting diodes, wherein at least one of the semiconductor light-emitting diodes includes a first conductive electrode and a second conductive electrode; a first conductive semiconductor layer on which the first conductive electrode is disposed; a second conductive semiconductor layer that overlaps with the first conductive semiconductor layer, on which the second conductive electrode is disposed; an active layer disposed between the first conductive semiconductor layer and the second conductive semiconductor layer; an undoped semiconductor layer disposed on the second conductive semiconductor layer; and protrusions formed of a porous material allowing electropolishing on the undoped semiconductor layer.

According to an embodiment, the protrusions may be formed of a second conductive semiconductor, and have a higher impurity concentration than the second conductive semiconductor layer.

According to an embodiment, the display device may further include an intermediate layer between the second conductive semiconductor layer and the undoped semiconductor layer, wherein the intermediate layer is formed of a second conductive semiconductor, and contains aluminum (Al).

According to an embodiment, the display device may include an oxide layer covering a side surface of the intermediate layer, wherein the oxide layer comprises an aluminum oxide layer ($Al_xO_y$).

According to an embodiment, the display device may include a passivation layer covering at least part of side surfaces of the first conductive semiconductor layer, the second conductive semiconductor layer, and the active layer.

In addition, the present disclosure relates to a method of manufacturing a display device, and the method may include a thin layer forming step of sequentially growing a conductive layer, a protective layer, a sacrificial layer, an undoped semiconductor layer, a second conductive semiconductor layer, an active layer and a first conductive semiconductor layer on a growth substrate; a first isolation step of etching at least part of the first conductive semiconductor layer, the active layer, and the second conductive semiconductor layer to form a passivation layer; a second isolation step of dry etching at least part of the passivation layer, the second conductive semiconductor layer, the undoped semiconductor layer, the sacrificial layer, and the protective layer; an electropolishing step of electrochemically etching the sacrificial layer to form a porous structure; and a mechanical lift-off step of cutting the porous structure to form protrusions. Specifically, the protective layer may contain aluminum (Al). Furthermore, the sacrificial layer may be formed of a second conductive semiconductor, and may have a higher impurity concentration than the second conductive semiconductor layer. In addition, a reaction gas of dry etching in the second isolation step may contain oxygen.

According to an embodiment, an aluminum composition ratio of the protective layer may be less than 50%.

According to an embodiment, the protective layer may be formed of a plurality of layers containing AlGaN and GaN, and at least one layer thereof may contain second conductive impurities.

According to an embodiment, an oxide layer covering a side surface of the protective layer may be formed in the second isolation step, and the oxide layer may include an aluminum oxide layer (AlxOy).

According to an embodiment, the method may further include an intermediate layer between the second conductive semiconductor layer and the undoped semiconductor layer, wherein the intermediate layer is formed of a second conductive semiconductor, and contains aluminum (Al).

According to an embodiment, an aluminum composition ratio of the intermediate layer may be less than 50%.

According to an embodiment, an oxide layer covering a side surface of the intermediate layer may be formed in the second isolation step, and the oxide layer may include an aluminum oxide layer (AlxOy).

According to an embodiment, the method may further include an electrode forming step of forming a first conductive electrode and a second conductive electrode corresponding to the first conductive semiconductor layer and the second conductive semiconductor layer, respectively.

According to an embodiment, the method may include etching the undoped semiconductor layer prior to forming the second conductive electrode.

In a display device according to the present disclosure, a layer of a porous material allowing electropolishing may be disposed and separated by a mechanical lift-off method when the semiconductor light-emitting diode is separated from the growth substrate, thereby prevent the semiconductor light-emitting diode from being damaged due to heat or chemicals. Furthermore, process cost may be reduced, thereby providing a display device with reduced manufacturing cost.

In addition, a display device of the present disclosure may include an intermediate layer containing aluminum between a second conductive semiconductor layer and the undoped semiconductor layer, and an aluminum oxide layer covering a side surface of the intermediate layer to prevent side surface etching in an electropolishing step and reduce leakage current through a side surface etching, thereby increasing the efficiency of the semiconductor light-emitting diode.

In addition, in a manufacturing method of manufacturing a semiconductor light-emitting diode, an aluminum oxide layer covering a side surface of a protective layer may be formed in a second isolation step of allowing oxygen to be contained as a reaction gas to place a protective layer containing aluminum between a conductive layer and a sacrificial layer on a growth substrate and form an array of semiconductor light-emitting diodes. In a subsequent electropolishing step, side surface etching may be prevented with an aluminum oxide layer to reduce leakage current through a side surface defect, thereby increasing the efficiency of the semiconductor light-emitting diode.

DETAILED DESCRIPTION OF THE EMBODIMENTS

Figure 1:
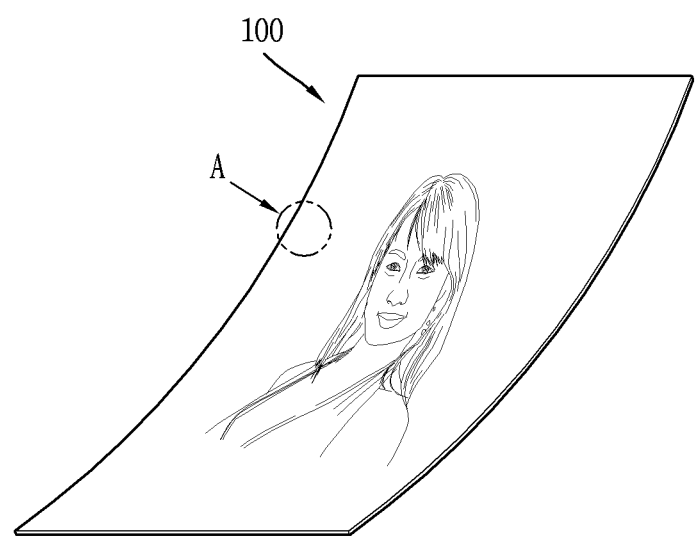
FIG. 1 is a conceptual view showing a display device using a semiconductor light-emitting diode according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting diode according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be realized in such a manner that a light emission of each unit pixel (sub-pixel) arranged in a matrix configuration is controlled independently. The sub-pixel denotes a minimum unit for implementing one color.

The sub-pixel of the flexible display may be implemented by a semiconductor light-emitting diode. According to the present disclosure, a light-emitting diode (LED) is illustrated as a type of semiconductor light-emitting diode. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
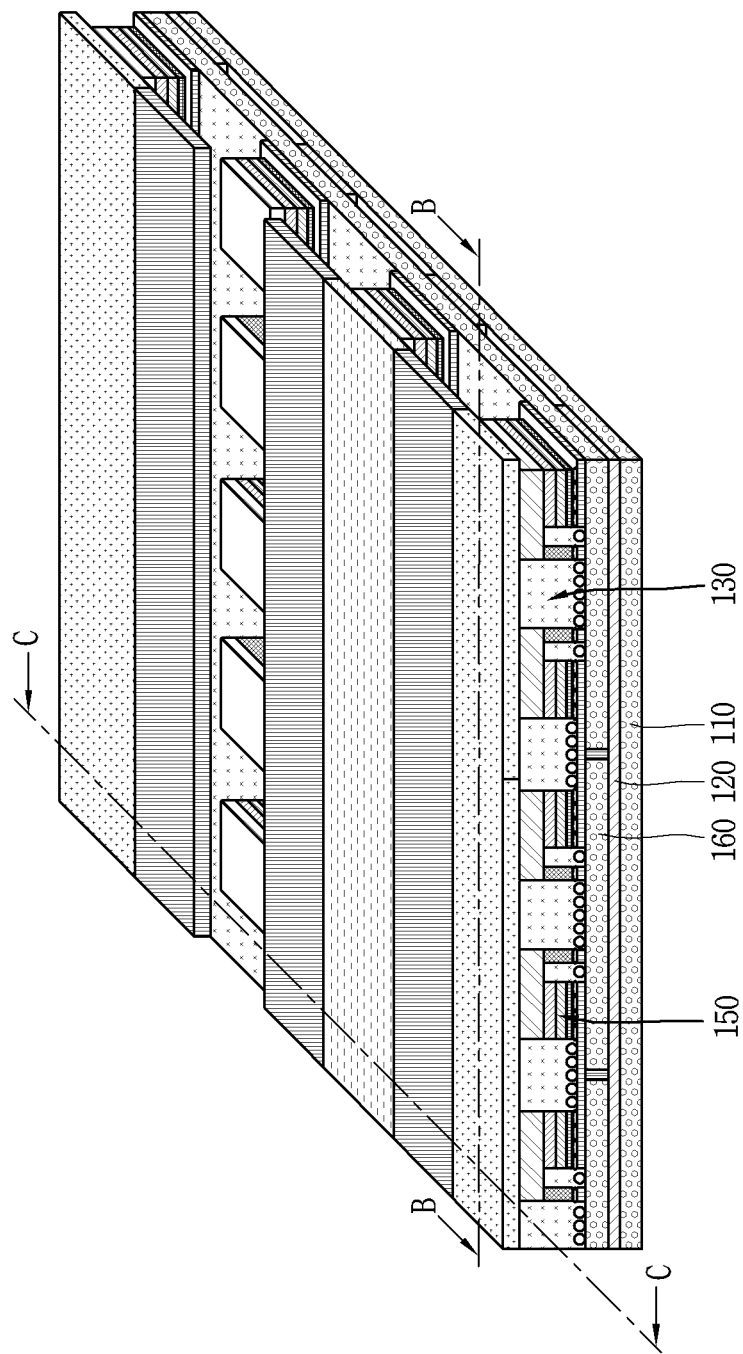
FIG. 2 is a partial enlarged view of portion "A" in FIG. 1, and FIGS. 3A and 3B are cross-sectional views taken along lines B-B and C-C in FIG. 2.
Figure 3A:
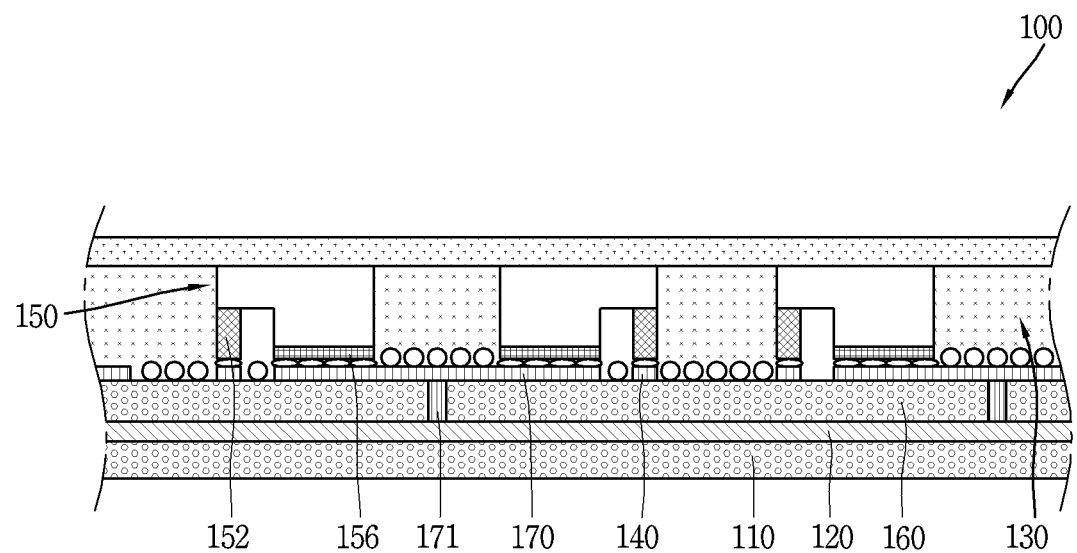
Figure 3B:
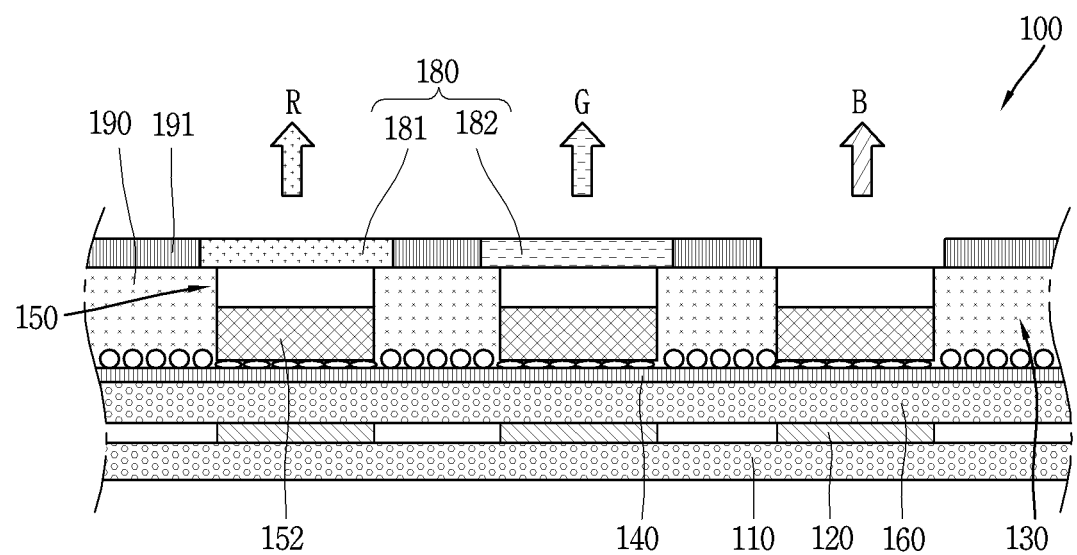
Figure 4:
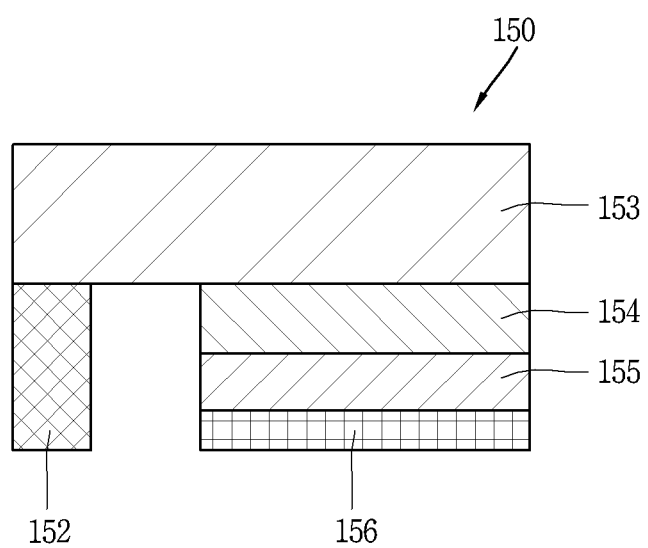
FIG. 4 is a conceptual view illustrating a flip-chip type semiconductor light-emitting diode in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting diode in FIG. 3A, and FIGS. 5A through 5C are conceptual views illustrating various forms for implementing colors in connection with a flip-chip type semiconductor light-emitting diode.

According to the drawings in FIGS. 2, 3A and 3B, there is illustrated a display device 100 using a passive matrix (PM) type semiconductor light-emitting diode as a display device 100 using a semiconductor light-emitting diode. However, an example described below may also be applicable to an active matrix (AM) type semiconductor light-emitting diode.

The display device 100 may include a substrate 110, a first electrode 120, a conductive adhesive layer 130, a second electrode 140, and a plurality of semiconductor light-emitting diodes 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light-emitting diode 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting diode 150 is connect thereto in a flip chip form with the application of heat and pressure, the semiconductor light-emitting diode 150 is electrically connected to the first electrode 120 and second electrode 140.

Referring to FIG. 4, the semiconductor light-emitting diode may be a flip chip type semiconductor light-emitting diode.

For example, the semiconductor light-emitting diode may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting diodes 150. For example, the left and right p-type electrodes of the semiconductor light-emitting diodes around the auxiliary electrode may be electrically connected to one auxiliary electrode.

More specifically, the semiconductor light-emitting diode 150 is pressed into the conductive adhesive layer 130, and through this, only a portion between the p-type electrode 156 and auxiliary electrode 170 of the semiconductor light-emitting diode 150 and a portion between the n-type electrode 152 and second electrode 140 of the semiconductor light-emitting diode 150 have conductivity, and the remaining portion does not have conductivity since there is no push-down of the semiconductor light-emitting diode. As described above, the conductive adhesive layer 130 may form an electrical connection as well as allow a mutual coupling between the semiconductor light-emitting diode 150 and the auxiliary electrode 170 and between the semiconductor light-emitting diode 150 and the second electrode 140.

Furthermore, a plurality of semiconductor light-emitting diodes 150 constitute a light-emitting array, and a phosphor layer 180 is formed on the light-emitting array.

The light-emitting diode array may include a plurality of semiconductor light-emitting diodes with different self-luminance values. Each of the semiconductor light-emitting diodes 150 constitutes a sub-pixel, and is electrically connected to the first electrode 120. For example, there may exist a plurality of first electrodes 120, and the semiconductor light-emitting diodes are arranged in several rows, for instance, and each row of the semiconductor light-emitting diodes may be electrically connected to any one of the plurality of first electrodes.

Furthermore, the semiconductor light-emitting diodes may be connected in a flip chip form, and thus semiconductor light-emitting diodes grown on a transparent dielectric substrate. Furthermore, the semiconductor light-emitting diodes may be nitride semiconductor light-emitting diodes, for instance. The semiconductor light-emitting diode 150 has an excellent luminance characteristic, and thus it may be possible to configure individual sub-pixels even with a small size thereof.

According to the drawing, a partition wall 190 may be formed between the semiconductor light-emitting diodes 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting diode 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting diode 150. For example, the semiconductor light-emitting diode 150 is a blue semiconductor light-emitting diode that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting diode 151 at a location implementing a red sub-pixel, and a green phosphor 182 capable of converting blue light into green (G) light may be deposited on the blue semiconductor light-emitting diode 151 at a location implementing a green sub-pixel. Furthermore, only the blue semiconductor light-emitting diode 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting diode 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
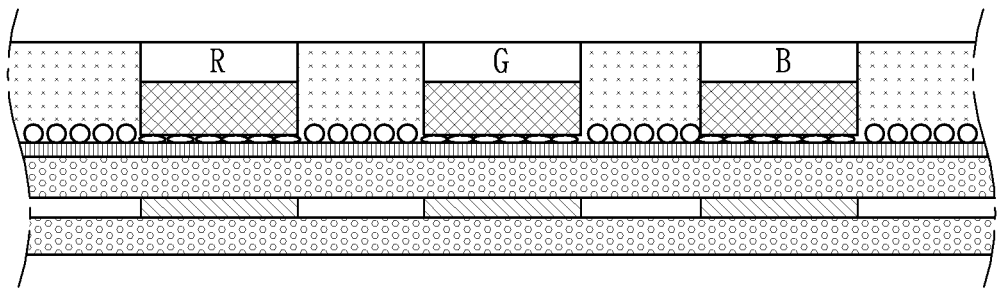
FIGS. 5A through 5C are conceptual views illustrating various forms for implementing colors in connection with a flip-chip type semiconductor light-emitting diode.

Referring to FIG. 5A, each of the semiconductor light-emitting diodes 150 may be implemented with a high-power light-emitting diode that emits various lights including blue in which gallium nitride (GaN) is mostly used, and indium (In) and or aluminum (Al) are added thereto.

In this case, the semiconductor light-emitting diode 150 may be red, green and blue semiconductor light-emitting diodes, respectively, to implement each sub-pixel. For instance, red, green and blue semiconductor light-emitting diodes (R, G, B) are alternately disposed, and red, green and blue sub-pixels implement one pixel by means of the red, green and blue semiconductor light-emitting diodes, thereby implementing a full color display.

Figure 5B:
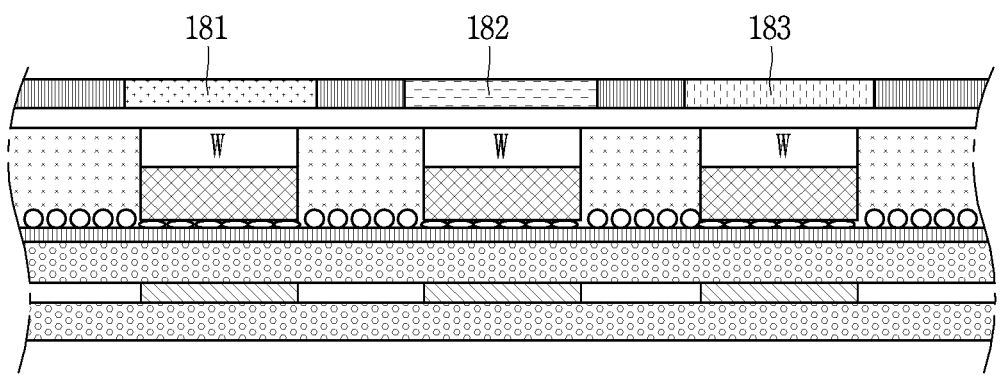

Referring to FIG. 5B, the semiconductor light-emitting diode may have a white light-emitting diode (W) provided with a yellow phosphor layer for each element. In this case, a red phosphor layer 181, a green phosphor layer 182 and a blue phosphor layer 183 may be provided on the white light-emitting diode (W) to implement a sub-pixel. Furthermore, a color filter repeated with red, green and blue on the white light-emitting diode (W) may be used to implement a sub-pixel.

Figure 5C:
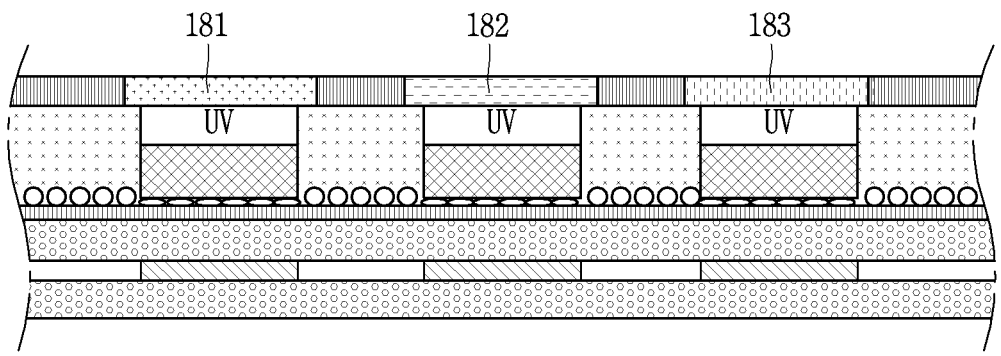

Referring to FIG. 5C, it may be possible to also have a structure in which a red phosphor layer 181, a green phosphor layer 182 and blue phosphor layer 183 may be provided on a ultra violet light-emitting diode (UV). In this manner, the semiconductor light-emitting diode can be used over the entire region up to ultra violet (UV) as well as visible light, and may be extended to a form of semiconductor light-emitting diode in which ultra violet (UV) can be used as an excitation source.

Taking the present example into consideration again, the semiconductor light-emitting diode 150 is placed on the conductive adhesive layer 130 to configure a sub-pixel in the display device. The semiconductor light-emitting diode 150 has an excellent luminance characteristic, and thus it may be possible to configure individual sub-pixels even with a small size thereof. The size of the individual semiconductor light-emitting diode 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting diode 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting diodes becomes sufficiently large. Accordingly, in this case, it may be possible to implement a flexible display device having a HD image quality.

A display device using the foregoing semiconductor light-emitting diode will be fabricated by a new type of manufacturing method. Hereinafter, the manufacturing method will be described with reference to FIG. 6.

Figure 6:
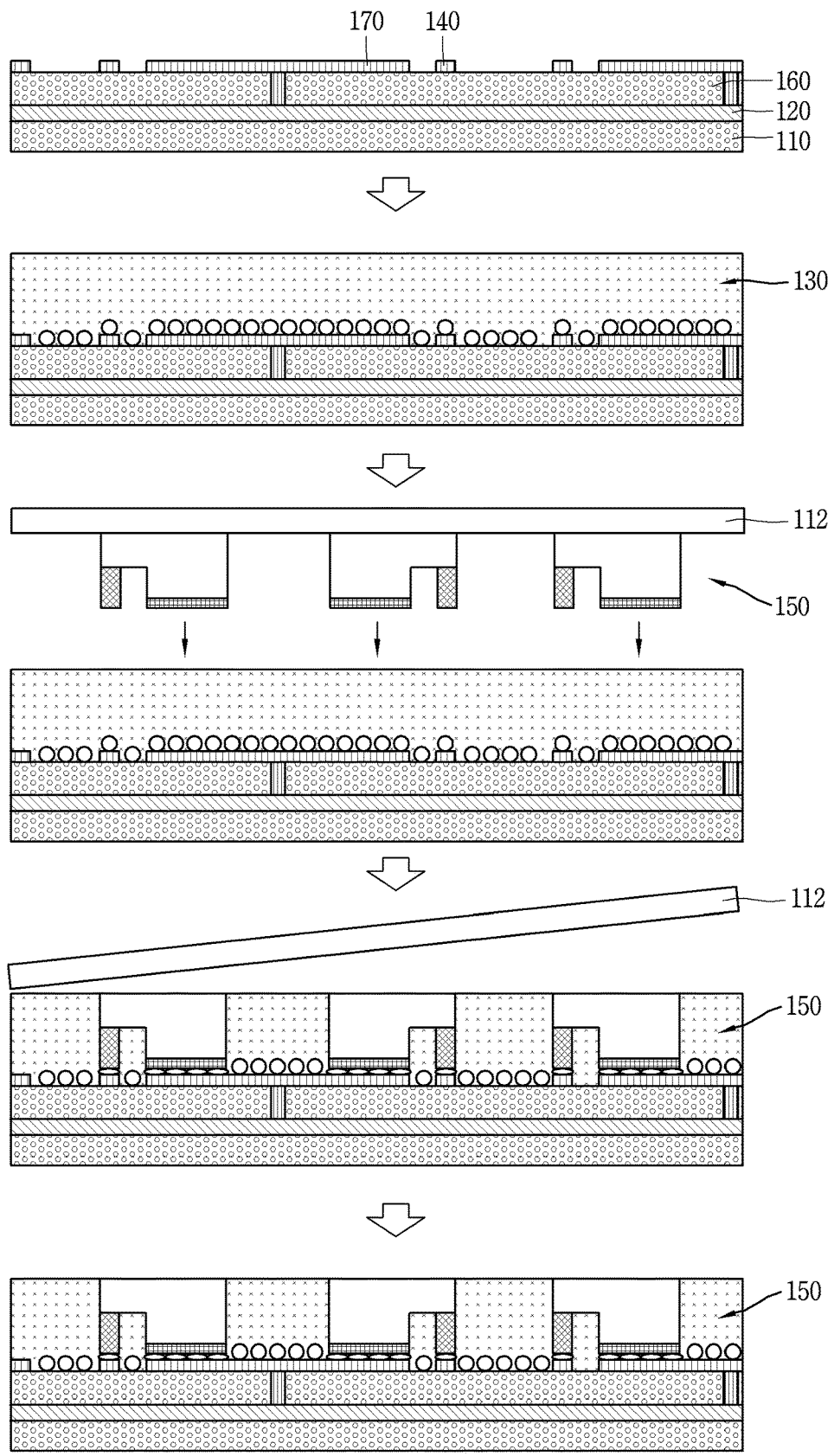
FIG. 6 is cross-sectional views illustrating a manufacturing method of a display device using a semiconductor light-emitting diode according to the present disclosure.

FIG. 6 is cross-sectional views illustrating a manufacturing method of a display device using a semiconductor light-emitting diode according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting diodes 150 corresponding to the location of the auxiliary electrodes 170 and second electrodes 140 and constituting individual pixels is disposed such that the semiconductor light-emitting diode 150 faces the auxiliary electrode 170 and second electrode 140.

In this case, the second substrate 112 as a growth substrate for growing the semiconductor light-emitting diode 150 may be a sapphire substrate or silicon substrate.

The semiconductor light-emitting diode may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting diode 150 and the auxiliary electrode 170 and second electrode 140 may have conductivity due to the characteristics of an anisotropic conductive film having conductivity by thermal compression, thereby allowing the electrodes and semiconductor light-emitting diode 150 to be electrically connected to each other. At this time, the semiconductor light-emitting diode 150 may be inserted into the anisotropic conductive film, thereby forming a partition wall between the semiconductor light-emitting diodes 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting diodes 150 to the outside. Silicon oxide (SiOx) or the like may be coated on the wiring substrate coupled to the semiconductor light-emitting diode 150 to form a transparent insulating layer (not shown).

Furthermore, it may further include the process of forming a phosphor layer on one surface of the semiconductor light-emitting diode 150. For example, the semiconductor light-emitting diode 150 may be a blue semiconductor light-emitting diode for emitting blue (B) light, and red or green phosphor for converting the blue (B) light into the color of the sub-pixel may form a layer on one surface of the blue semiconductor light-emitting diode.

The manufacturing method or structure of a display device using the foregoing semiconductor light-emitting diode may be modified in various forms. For such an example, the foregoing display device may be applicable to a vertical semiconductor light-emitting diode. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
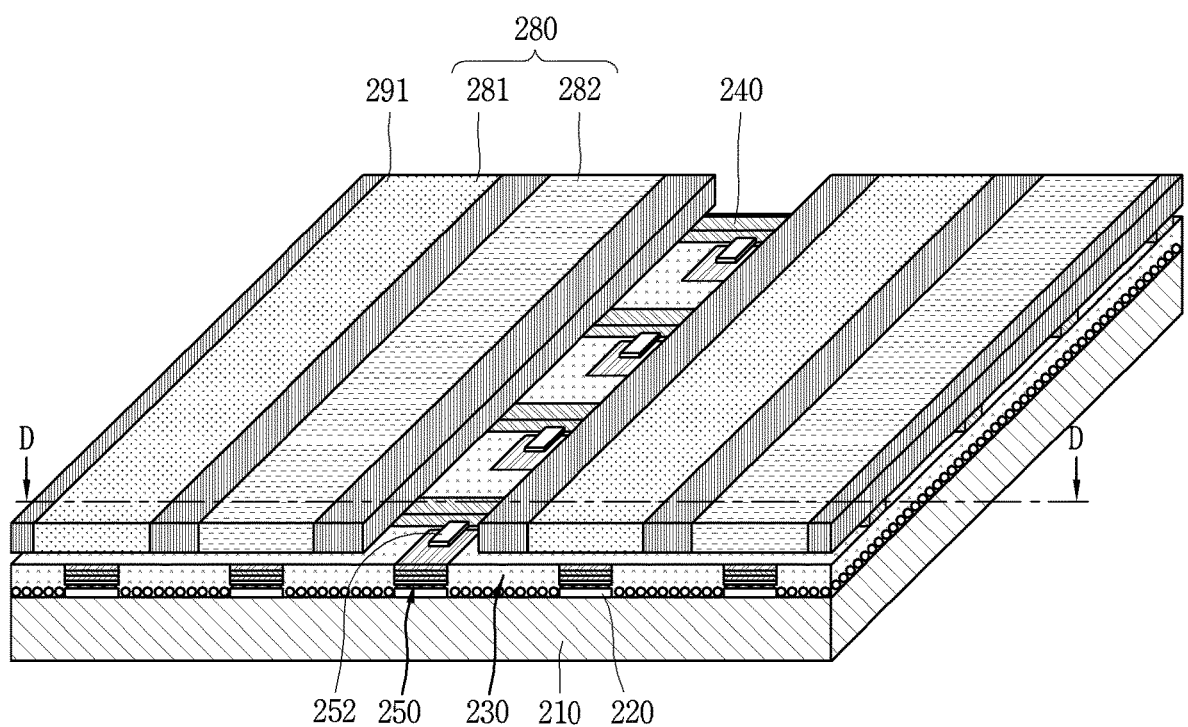
FIG. 7 is a perspective view showing a display device using a semiconductor light-emitting diode according to another embodiment of the present disclosure.
Figure 8:
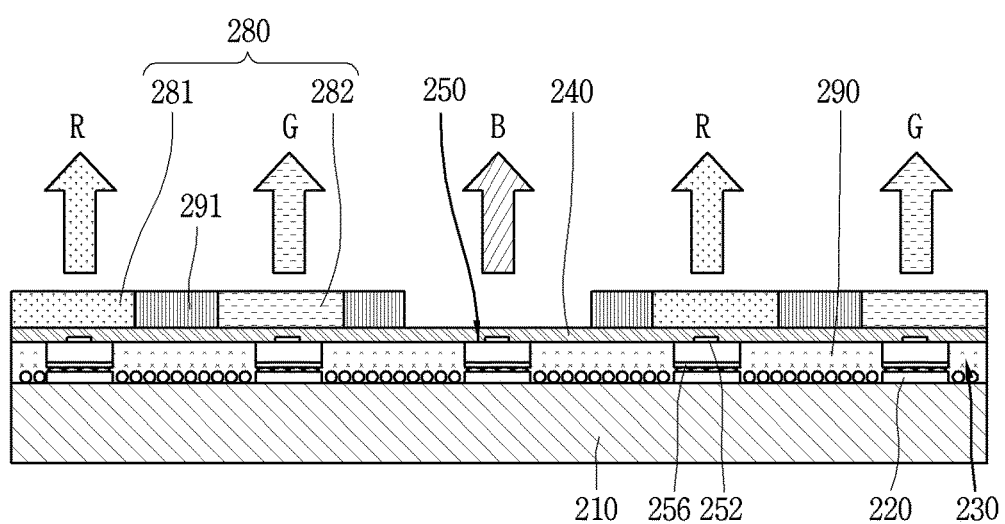
FIG. 8 is a cross-sectional view taken along line D-D in FIG. 7.
Figure 9:
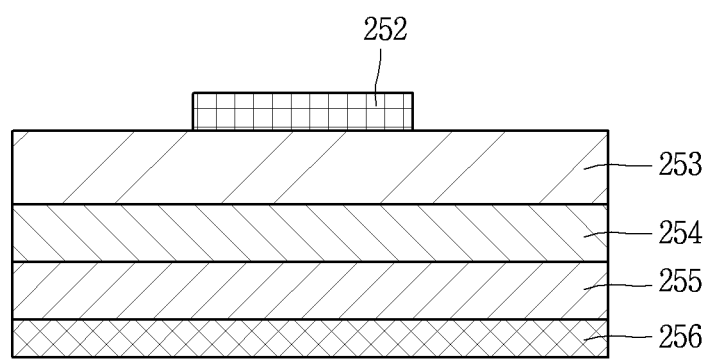
FIG. 9 is a conceptual view showing a vertical semiconductor light-emitting diode in FIG. 8.

FIG. 7 is a perspective view illustrating a display device using a semiconductor light-emitting diode according to another embodiment of the present disclosure. FIG. 8 is a cross-sectional view taken along line C-C in FIG. 7, and FIG. 9 is a conceptual view illustrating a vertical type semiconductor light-emitting diode in FIG. 8.

According to the drawings, the display device may be display device using a passive matrix (PM) type of vertical semiconductor light-emitting diode.

The display device may include a substrate 210, a first electrode 220, a conductive adhesive layer 230, a second electrode 240 and a plurality of semiconductor light-emitting diodes 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting diode is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting diode 250 thereto, the semiconductor light-emitting diode 250 is electrically connected to the first electrode 220. At this time, the semiconductor light-emitting diode 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting diode 250 and the first electrode 220.

In this manner, the semiconductor light-emitting diode 250 is placed on the conductive adhesive layer 230, thereby configuring a separate sub-pixel in the display device. The semiconductor light-emitting diode 250 has an excellent luminance characteristic, and thus it may be possible to configure individual sub-pixels even with a small size thereof. The size of the individual semiconductor light-emitting diode 250 may be less than 80 μm in the length of one side thereof, and formed with a rectangular or square shaped element. In case of a rectangular shaped element, the size thereof may be less than 20×80 μm.

The semiconductor light-emitting diode 250 may be a vertical structure.

A plurality of second electrodes 240 disposed in a direction of crossing the length direction of the first electrode 220, and electrically connected to the vertical semiconductor light-emitting diode 250 may be located between vertical semiconductor light-emitting diodes.

Referring to FIG. 9, the vertical semiconductor light-emitting diode may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting diode 250, thereby providing a great advantage capable of reducing the chip size.

Referring again to FIG. 8, a phosphor layer 280 may be formed on one surface of the semiconductor light-emitting diode 250. For example, the semiconductor light-emitting diode 250 is a blue semiconductor light-emitting diode 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting diode 251 at a location implementing a red sub-pixel, and a green phosphor 282 capable of converting blue light into green (G) light may be deposited on the blue semiconductor light-emitting diode 251 at a location implementing a green sub-pixel. Furthermore, only the blue semiconductor light-emitting diode 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting diode is applied.

Taking the present embodiment into consideration again, the second electrode 240 is located between the semiconductor light-emitting diodes 250, and electrically connected to the semiconductor light-emitting diodes 250. For example, the semiconductor light-emitting diodes 250 may be disposed in a plurality of rows, and the second electrode 240 may be located between the rows of the semiconductor light-emitting diodes 250.

Since a distance between the semiconductor light-emitting diodes 250 constituting individual pixels is sufficiently large, the second electrode 240 may be located between the semiconductor light-emitting diodes 250.

The second electrode 240 may be formed with a bar-shaped electrode elongated in one direction, and disposed in a perpendicular direction to the first electrode.

Furthermore, the second electrode 240 may be electrically connected to the semiconductor light-emitting diode 250 by a connecting electrode protruded from the second electrode 240. More specifically, the connecting electrode may be an n-type electrode of the semiconductor light-emitting diode 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting diode 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting diode 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting diode 250, the ITO material has a problem of bad adhesiveness with an n-type semiconductor. Accordingly, the second electrode 240 may be placed between the semiconductor light-emitting diodes 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting diodes 250. In other words, the partition wall 290 may be disposed between the vertical semiconductor light-emitting diodes 250 to isolate the semiconductor light-emitting diode 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting diode 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting diodes 250, the partition wall 290 may be located between the vertical semiconductor light-emitting diodes 250 and the second electrodes 240. Accordingly, individual sub-pixels may be configured even with a small size using the semiconductor light-emitting diode 250, and a distance between the semiconductor light-emitting diodes 250 may be relatively sufficiently large to place the second electrode 240 between the semiconductor light-emitting diodes 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting diode 250 is placed on the conductive adhesive layer 230, thereby configuring a separate sub-pixel in the display device. The semiconductor light-emitting diode 250 has an excellent luminance characteristic, and thus it may be possible to configure individual sub-pixels even with a small size thereof. As a result, it may be possible to implement a full color display in which the sub-pixels of red (R), green (G) and blue (B) implement one pixel by means of the semiconductor light-emitting diode.

In a display device using the semiconductor light-emitting diode of the present disclosure described above, a laser lift-off (LLO) method or a chemical lift-off (CLO) method may be used to separate the semiconductor light-emitting diode from the growth substrate. When the semiconductor light-emitting diode is separated using the laser lift-off method or the chemical lift-off method, damage to the semiconductor light-emitting diode may be caused by heat or chemicals caused by the laser. In addition, there is a problem in that process cost is increased due to high facility cost, thereby increasing manufacturing cost. Accordingly, in the present disclosure, a display device having a new structure capable of solving such a problem will be described.

In other words, according to the present disclosure, when the semiconductor light-emitting diode is separated from the growth substrate, it may be possible to prevent the semiconductor light-emitting diode from being damaged by heat or chemicals caused by laser, and reducing manufacturing cost.

Moreover, a display device of the present invention may include an intermediate layer containing aluminum between a second conductive semiconductor layer and the undoped semiconductor layer, and an aluminum oxide layer covering a side surface of the intermediate layer to prevent side surface etching in an electropolishing step and reduce leakage current through a side surface etching, thereby increasing the efficiency of the semiconductor light-emitting diode. Hereinafter, a display device having a new structure will be described in detail.

Figure 10:
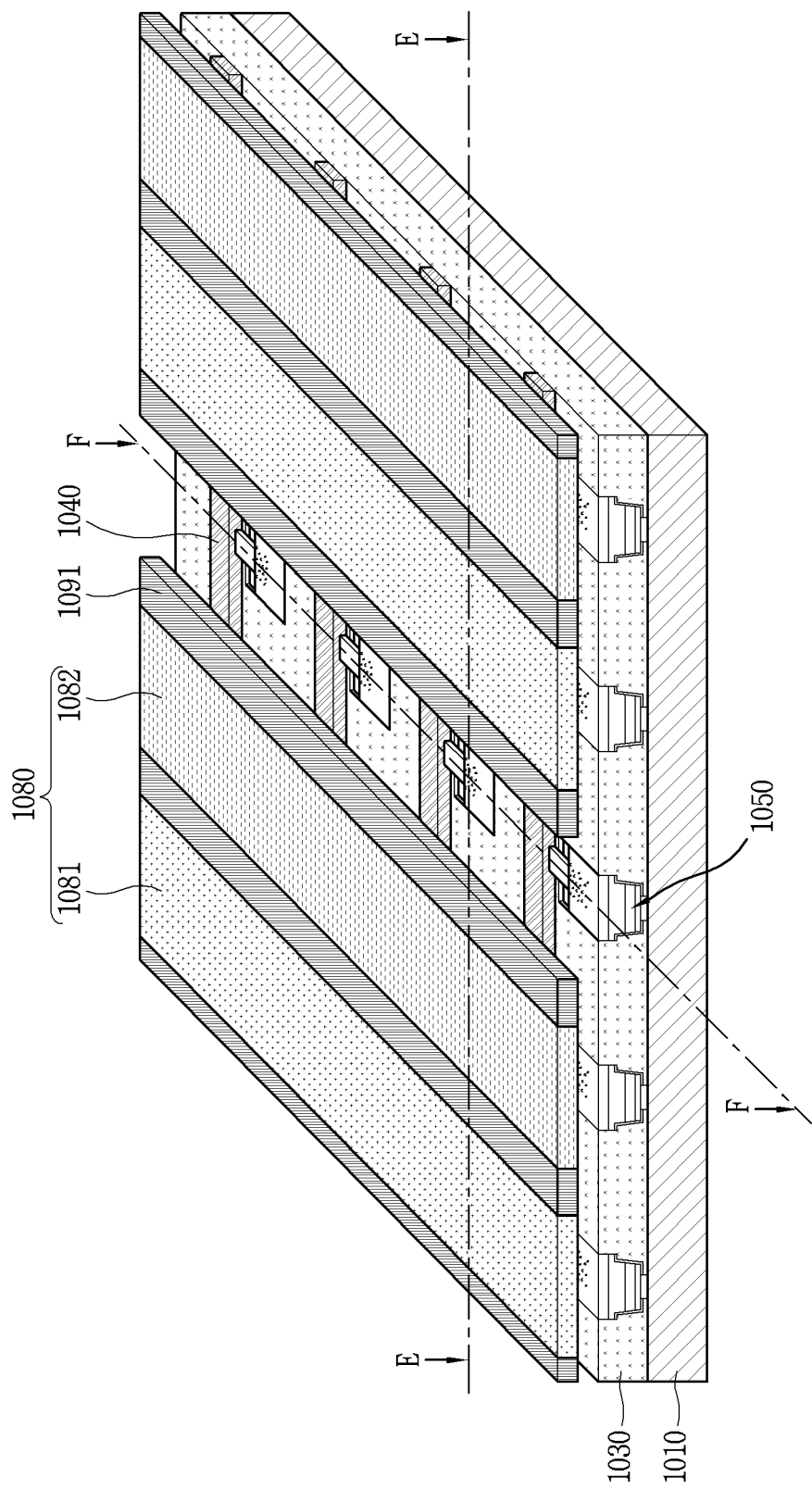
FIG. 10 is an enlarged view of portion "A" in FIG. 1 for explaining another embodiment of the present disclosure to which a display device having a new structure is applied.
Figure 11:
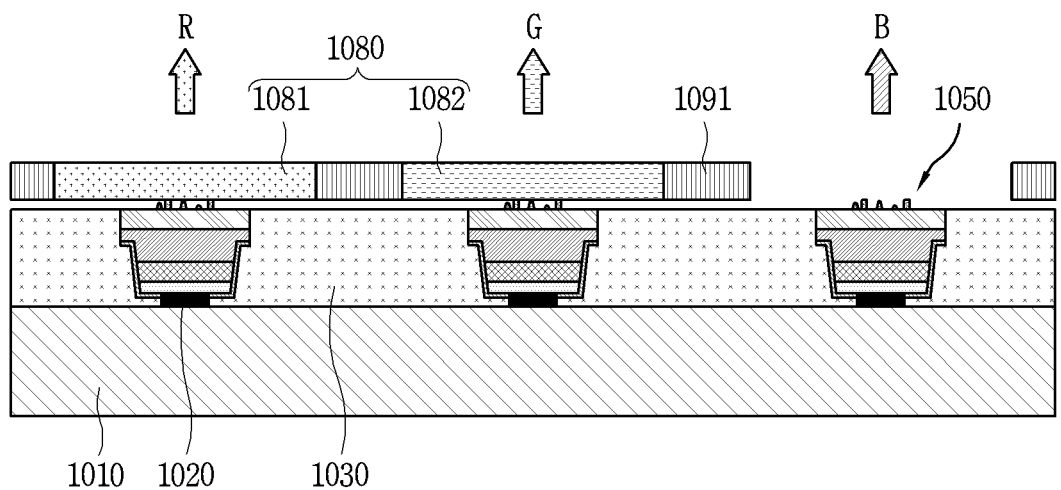
FIG. 11 is a cross-sectional view taken along line E-E in FIG. 10.

FIG. 10 is an enlarged view of portion "A" in FIG. 1 for explaining still another embodiment of the present disclosure of a display device having a new structure. FIG. 11 is a cross-sectional view taken along line E-E in FIG. 10, and FIG. 12 is a cross-sectional view taken along line F-F of FIG. 10.

Figure 12:
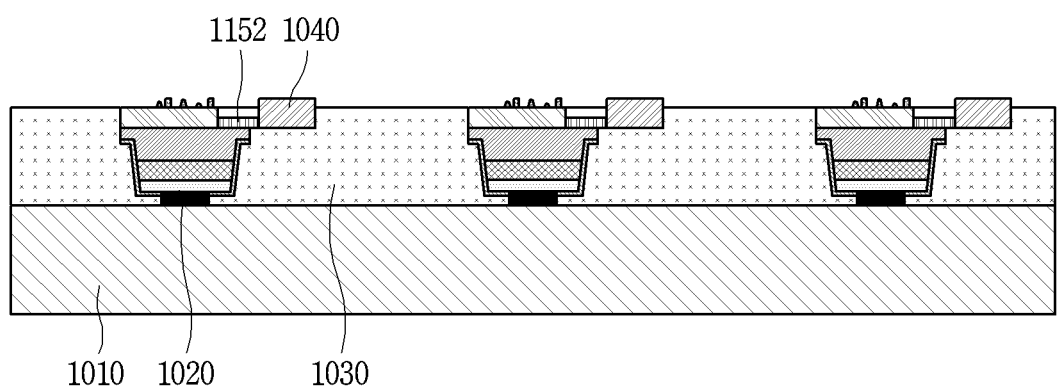
FIG. 12 is a cross-sectional view taken along line F-F in FIG. 10.

According to the drawings in FIGS. 10 through 12, as a display device 1000 using a semiconductor light-emitting diode, it may be also applicable to the display device 1000 using a passive matrix (PM) type semiconductor light-emitting diode or an active matrix (AM) type semiconductor light-emitting diode.

The display device 1000 may include a substrate 1010, a first electrode 1020, an insulating member 1030, a second electrode 1040, and a plurality of semiconductor light-emitting diodes 1050. Here, the first electrode 1020 may be disposed on the substrate 1010 and formed as a line.

The substrate 1010 as a wiring substrate disposed with the first electrode 1020 may include polyimide (PI) to implement a flexible display device. Furthermore, according to circumstances, the substrate 1010 may be formed of an insulating but non-flexible material. Furthermore, the substrate 1010 may be either one of transparent and non-transparent materials.

As illustrated, the insulating member 1030 may be formed to cover the semiconductor light-emitting diodes 1050. In an embodiment, the insulating member 1030 may include polydimethylsiloxane (PDMS) or polymethylphenylsiloxane (PMPS) as a polymer material, and may include various insulating materials that cover the semiconductor light-emitting diode 1050. The first conductive electrode 1156 and the second conductive electrode 1152 of the semiconductor light-emitting diodes 1050 may be electrically coupled to the first electrode 1020 and the second electrode 1040, respectively, in a corresponding manner.

Moreover, the display device 1000 may further include a phosphor layer 1080 formed on a surface of the plurality of semiconductor light-emitting diodes 1050. For example, the semiconductor light-emitting diode 1050 is a blue semiconductor light-emitting diode that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels.

In other words, a red phosphor 1081 capable of converting blue light into red (R) light may be deposited on a blue semiconductor light-emitting diode 1051a at a location implementing a red sub-pixel, and a green phosphor 1082 capable of converting blue light into green (G) light may be deposited on the blue semiconductor light-emitting diode 1051b at a location implementing a green sub-pixel. Furthermore, only the blue semiconductor light-emitting diode 1051c may be solely used at a location implementing a blue sub-pixel. In this case, the red (R), green (G) and blue (B) sub-pixels may implement one pixel. The semiconductor light-emitting diode 1050 may be combined with a quantum dot (QD) instead of a phosphor to implement sub-pixels that emit red (R), green (G) and blue (B).

Furthermore, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection.

Figure 13A:
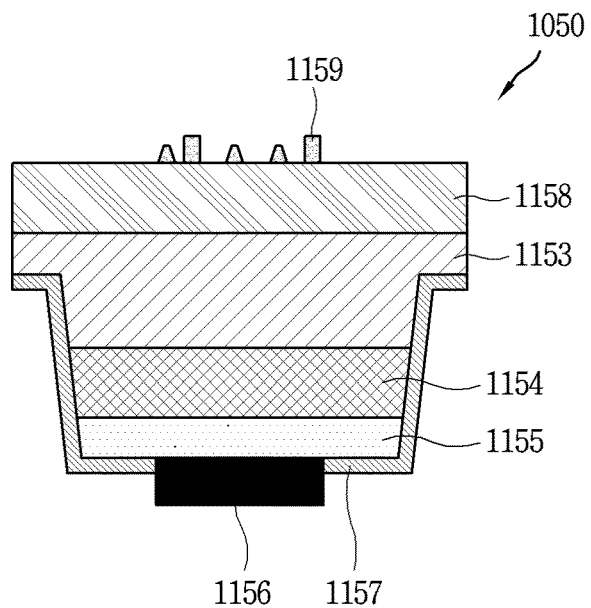
FIG. 13A is a conceptual view showing a vertical semiconductor light-emitting diode in FIG. 11.
Figure 13B:
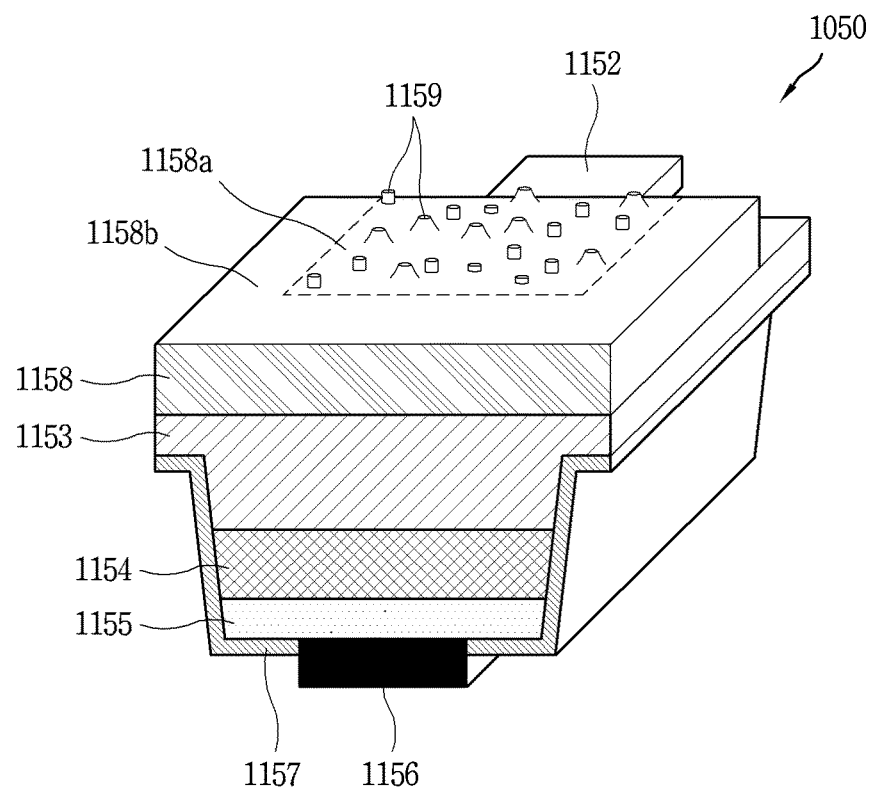
FIG. 13B is a conceptual view showing a vertical semiconductor light-emitting diode in FIG. 11.

On the other hand, FIG. 13A is a conceptual view illustrating a vertical semiconductor light-emitting diode 1050 in FIG. 11, and FIG. 13B is a perspective view illustrating a vertical semiconductor light-emitting diode 1050 in FIG. 11.

The semiconductor light-emitting diode 1050 of the display device 1000 includes a first conductive semiconductor layer 1155, an active layer 1154, a second conductive semiconductor layer 1153, a first conductive electrode 1156, and a second conductive electrode 1152, a passivation layer 1157, an undoped semiconductor layer 1158, and protrusions 1159.

The first conductive semiconductor layer 1155, the active layer 1154, and the second conductive semiconductor layer 1153 are overlapped and sequentially deposited, and the first conductive electrode 1156 may be formed on the first conductive semiconductor layer 1155. Furthermore, the undoped semiconductor layer 1158 may be disposed on the second conductive semiconductor layer 1153. Furthermore, the protrusions 1159 formed of a porous material capable of electropolishing may be disposed on the undoped semiconductor layer 1158.

In an embodiment, the first conductive semiconductor layer 1155, the active layer 1154, the second conductive semiconductor layer 1153, the undoped semiconductor layer 1158 and the protrusion 1159 may be formed of a semiconductor formed of gallium nitride (GaN). In detail, the first conductive semiconductor layer 1155 may be formed of p-GaN implanted with p-type impurities. Meanwhile, the second conductive semiconductor layer 1153, and the protrusion 1159 may be formed of n-GaN implanted with n-type impurities. Moreover, the n-type impurities may be silicon (Si).

Meanwhile, the undoped semiconductor layer 1158 formed on the second conductive semiconductor layer 1153 may be formed. Moreover, the undoped semiconductor layer 1158 may be formed to overlap with at least part of the second conductive semiconductor layer 1153, and the second conductive electrode 1152 may be formed at a portion where the second conductive semiconductor layer 1153 is exposed to the outermost edge. Furthermore, a first region 1158a and a second region 1158b may be provided on a surface of the undoped semiconductor layer 1158. Specifically, the first region 1158a has a larger surface roughness than the second region 1158b, and a plurality of protrusions 1159 are disposed in the first region 1158a.

In an embodiment, the protrusion 1159 may include second conductive impurities, and the protrusion 1159 may have a higher impurity concentration than the second conductive semiconductor layer 1153. Specifically, the second conductive semiconductor layer 1153 may have an impurity concentration at a level of $10^{17}/cm^3$, and the protrusion 1159 may have an impurity concentration above $10^{19}/cm^3$.

Moreover, the protrusion 1159 may be a porous structure having pores formed therein. Accordingly, even when the protrusion 1159 is formed on the outermost edge of the semiconductor light-emitting diode 1050, light emitted from the semiconductor light-emitting diode 1050 may not be disturbed, and the loss of the emitted light may be minimized, and a large amount of light may be emitted to the light-emitting surface.

Furthermore, an upper surface of the protrusions 1159 may be formed as a flat cut surface. In addition, part of the protrusions 1159 may have a cylindrical shape. In addition, another part of the protrusions 1159 may have a conical shape.

Besides, the protrusions 1159 may include different heights. Specifically, the protrusions 1159 may have a height of less than 2 μm, and preferably include different heights of less than 1 μm.

Furthermore, the semiconductor light-emitting diode 1050 includes a passivation layer 1157 covering at least part of the surfaces of the first conductive semiconductor layer 1155, the active layer 1154, and the second conductive semiconductor layer 1153.

In detail, the passivation layer 1157 may cover a side surface of the semiconductor light-emitting diode to allow the first conductive semiconductor layer 1155 and the second conductive semiconductor layer 1153 to be electrically disconnected from each other and insulated from each other. In other words, the passivation layer 1157 is made to stabilize the characteristics of the to semiconductor light-emitting diode 1050, and is formed of an insulating material.

For an example, the passivation layer 1157 may be an insulating thin layer made of a silicon compound or oxide. More specifically, the passivation layer 1157 may be formed of one or more materials of AlxOy, SixOy, SixNy, SnxOy, TixOy, CrOx, and ZrOx.

Moreover, the passivation layer 1157 may be formed as a single layer to reflect light emitted to side surfaces of the first conductive semiconductor layer 1155 and the second conductive semiconductor layer 1153.

In addition, the passivation layer 1157 may include a plurality of passivation layers having different refractive indices repeatedly deposited with materials having a relatively high refractive index and a material having a relatively low refractive index to reflect light emitted to the side surfaces of the first conductive semiconductor layer 1155 and the second conductive semiconductor layer 1153.

FIGS. 14A through 14E are cross-sectional views showing a method of manufacturing a display device 1000 according to another embodiment of the present disclosure. According to a manufacturing method of the display device 1000 which will be described below, the same or similar reference numerals are designated to the same or similar configurations to the foregoing embodiment, and the description thereof will be substituted by the earlier description.

The manufacturing method of the display device 1000 includes a thin layer formation step, a first isolation step, a second isolation step, an electropolishing step, and a mechanical lift-off step.

Referring to 14A, which is a view showing a thin layer formation step, a conductive layer 1060, a protective layer 1070', a sacrificial layer 1159', an undoped semiconductor layer 1158', a second conductive semiconductor layer 1153', an active layer 1154', and a first conductive semiconductor layer 1155' are sequentially deposited and grown on a growth substrate (W).

Specifically, the growth substrate (W) may be formed of a sapphire substrate or a silicon substrate. In addition, the growth substrate (W) may be formed of a plurality of layers including an undoped semiconductor layer and a doped semiconductor layer. The conductive layer 1060, which is a layer to which a current is applied in an electropolishing step described later, and may include second conductive impurities.

Meanwhile, the protective layer 1070' is formed of a second conductive semiconductor, and includes aluminum (Al). In detail, the protective layer 1070' may be formed of AlGaN, and an aluminum composition ratio of the protective layer 1070' may be below 50%. In addition, a thickness range of the protective layer 1070' may preferably be formed in a range of 0.1 to 1 μm.

The composition ratio of the aluminum and the thickness range of the protective layer are optimized to reduce defects on a side surface of the semiconductor light-emitting diode while forming a uniform etching in an electropolishing step described later. In other words, when the composition ratio of the aluminum exceeds 50% and the thickness exceeds 1 μm, the etching of the sacrificial layer, which will be described later, is non-uniformly formed, resulting in an increase in defects on a side surface of the semiconductor light-emitting diode.

Furthermore, the second conductive impurities may be included in order to efficiently perform the electropolishing step described later, and in to detail, the impurities may include silicon (Si). Moreover, the silicon impurities may have a range of $10^{17}$ to $10^{19}/cm^3$.

In addition, the protective layer 1070' may be formed of a plurality of layers, and at least one of the plurality of layers forming the protective layer 1070' may include second conductive impurities. Specifically, the protective layer may be a plurality of layers formed of AlGaN and GaN, and a combination thereof may be as follows in 1) through 3).

1) AlGaN containing second conductive impurities and GaN containing second conductive impurities
2) GaN containing undoped AlGaN and second conductive impurities
3) AlGaN and undoped GaN containing second conductive impurities Meanwhile, the sacrificial layer 1159' may be formed of a second conductive semiconductor, and may have a higher impurity concentration than the second conductive semiconductor layer 1153'. In detail, an impurity concentration of the second conductive semiconductor layer 1153' may be formed at a level of $10^{17}/cm^3$, and the sacrificial layer 1159' may have an impurity concentration above $10^{19}/cm^3$.

Moreover, an undoped semiconductor layer 1158', a second conductive semiconductor layer 1153', an active layer 1154', and a first conductive semiconductor layer 1155' are deposited on the sacrificial layer 1159'.

In one embodiment, it may further include an intermediate layer (not shown) between the undoped semiconductor layer 1158' and the second conductive semiconductor layer 1153'. This may be formed by a semiconductor light-emitting diode in FIG. 15 which will be described later. In this case, the intermediate layer may be formed of a second conductive semiconductor, and may include aluminum (Al). In detail, the intermediate layer may be formed of AlGaN, and an aluminum composition ratio of the intermediate layer may be below 50%. In addition, a thickness range of the intermediate layer may preferably be formed in a range of 0.1 to 3 μm.

Figure 14A:
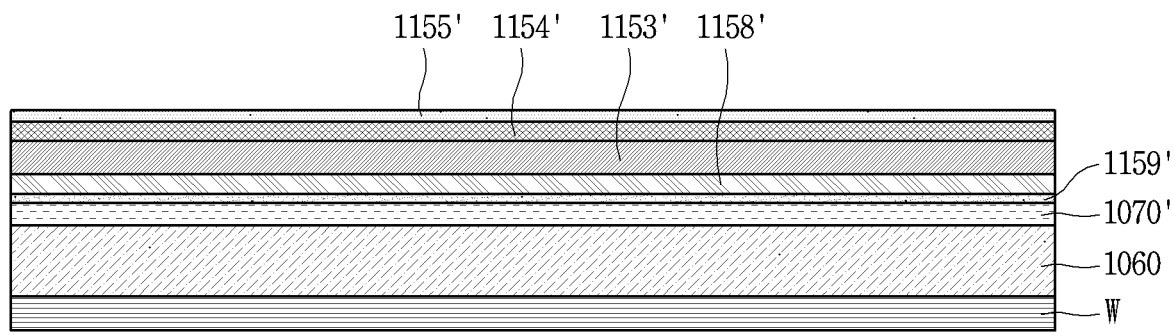
FIGS. 14A to 14E are cross-sectional views showing a method of manufacturing the vertical semiconductor light-emitting diode in FIG. 11.
Figure 14B:
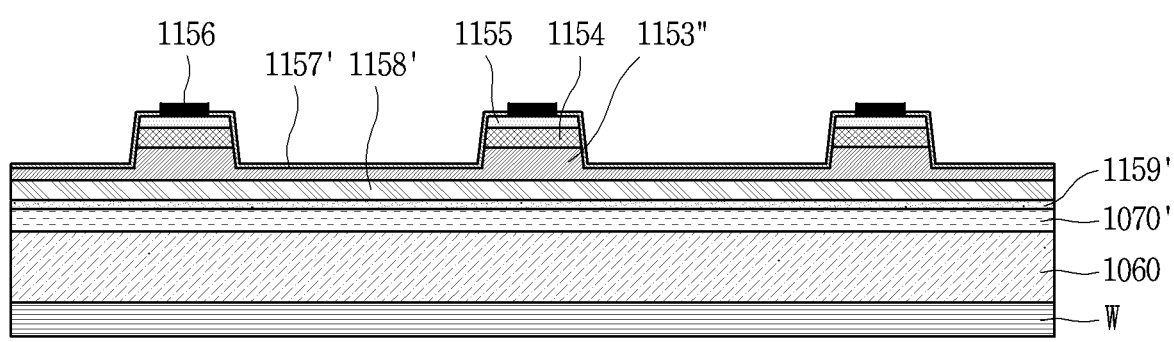

Referring to FIG. 14B, which is a view illustrating a first isolation step, at least part of the second conductive semiconductor layer 1153', the active layer 1154', and the first conductive semiconductor layer 1155' in FIG. 14A are etched to form a second conductive semiconductor layer 1153", the active layer 1154, and the first conductive semiconductor layer 1155. Furthermore, the first conductive electrode 1156 is formed on the first conductive semiconductor layer 1155, and a passivation layer 1157' is formed thereon.

Figure 14C:
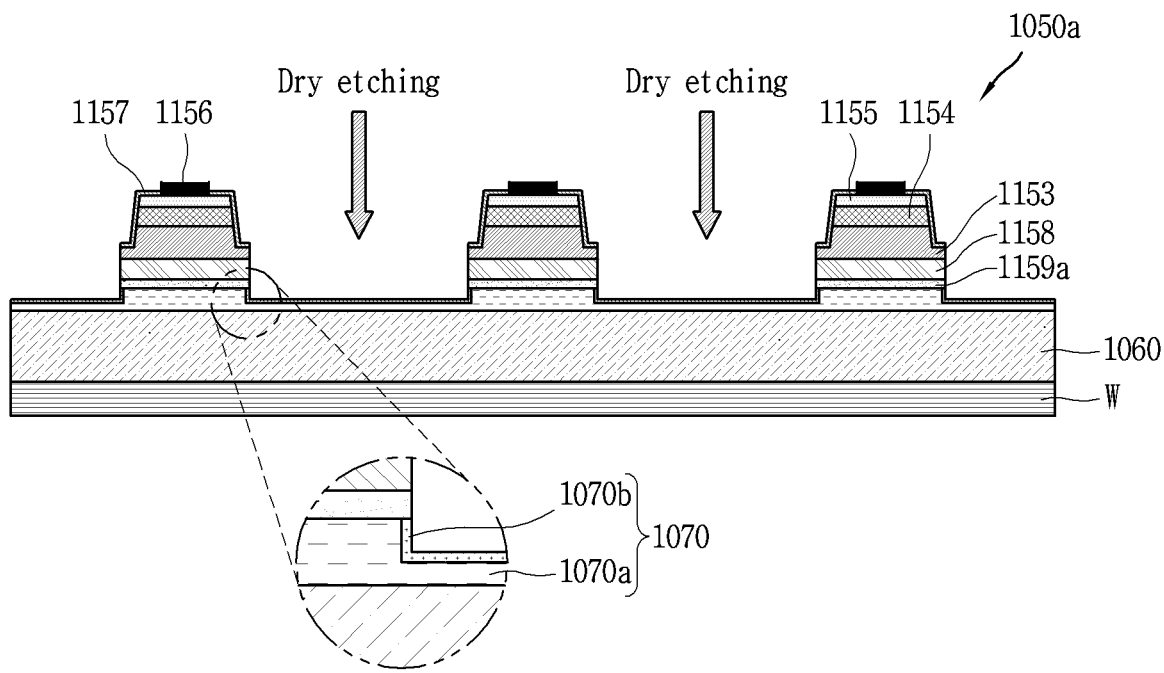

Referring to FIG. 14C, which is a view illustrating a second isolation step, at least part of the passivation layer 1157', the second conductive semiconductor layer 1153", the undoped semiconductor layer 1158', the sacrificial layer 1159', and the protective layer 1070' in FIG. 14B are dry-etched to form an array of the semiconductor light-emitting diodes 1050a. The passivation layer 1157, the second conductive semiconductor layer 1153, the undoped semiconductor layer 1158, the sacrificial layer 1159a, and the protective layer 1070 may be formed by the dry etching.

The reaction gas of the dry etching contains oxygen. Accordingly, a surface of the protective layer 1070 containing aluminum may be oxidized by oxygen to form an aluminum oxide layer 1070b, and a protective layer 1070a may be formed inside the aluminum oxide layer 1070b.

Furthermore, the protective layer 1070 includes aluminum and serves to prevent the conductive layer 1060 from being etched because the etching rate rapidly decreases when dry etching is performed.

In one embodiment, when an intermediate layer (not shown) containing aluminum is provided between the undoped semiconductor layer 1158 and the second conductive semiconductor layer 1153, the aluminum oxide layer may also be formed on a surface of the intermediate layer.

Figure 14D:
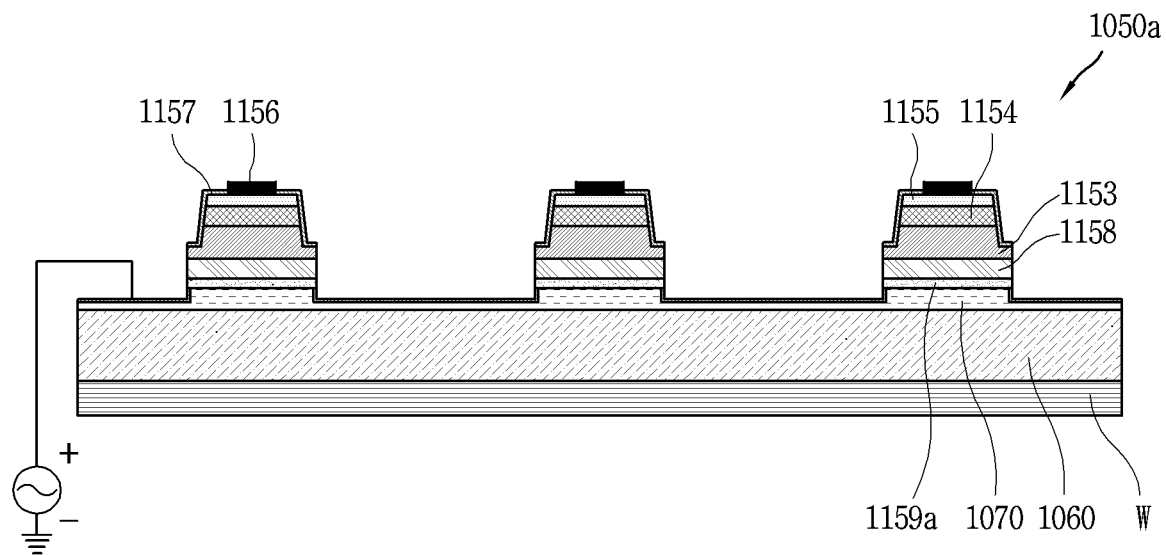
Figure 14E:
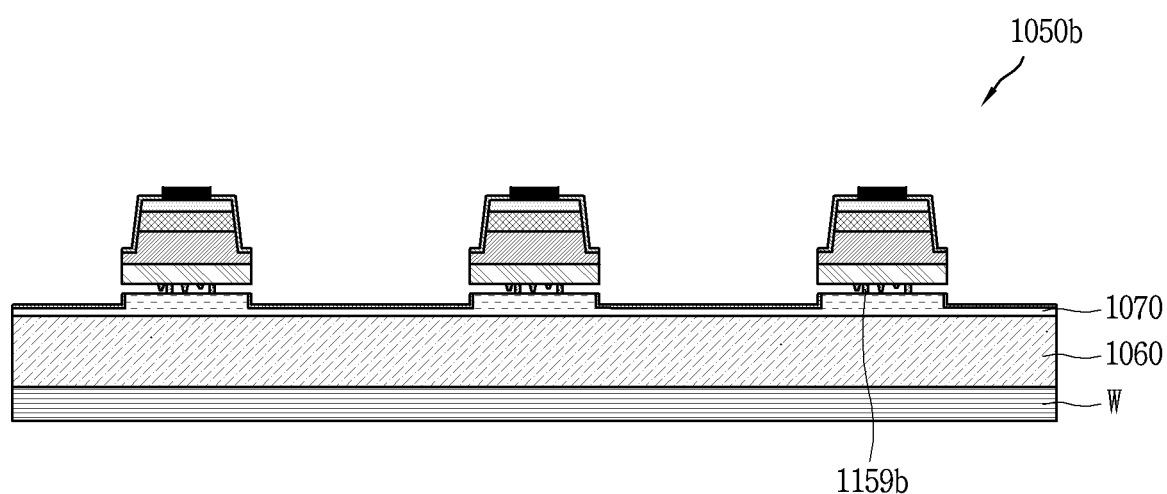

Referring to FIGS. 14D and 14E, which is a view illustrating an electropolishing step, electropolishing is performed by immersing the semiconductor light-emitting diode 1050a of FIG. 14C in an electrolyte solution. In detail, in the electropolishing step, the sacrificial layer 1159a may be electrolytically etched to form a porous structure 1159b. Accordingly, an array of the semiconductor light-emitting diodes 1050b may be formed.

Meanwhile, the undoped semiconductor layer 1159 may be disposed between the semiconductor light-emitting diode 1050a and the second sacrificial layer 1160" to which a current is applied, thereby preventing the second conductive semiconductor layer 1153 of the semiconductor light-emitting diode 1050a from being etched during the electrolytic etching process.

Furthermore, the protective layer 1070 a side surface of which is covered with an aluminum oxide layer may prevent the side surface from being etched in the electropolishing step to reduce leakage current through a defect of the side surface, thereby increasing the efficiency of the semiconductor light-emitting diode. In addition, the protective layer 1070 prevents the conductive layer 1060 from being vertically etched by an electrolytic solution and an electropolishing process, thereby allowing the sacrificial layer 1159a to be uniformly etched.

The semiconductor light-emitting diode 1050b may be bonded to the foregoing substrate 1010, and separated from the growth substrate (W) to manufacture the display device 1000. As the semiconductor light-emitting diode 1050b is separated from the growth substrate (W), a porous structure 1159b may be cut to form the foregoing protrusion 1159.

The porous structure 1159b may be cut by physical energy to form protrusions 1159 having different heights. Accordingly, an upper surface of the protrusions 1159 may be formed as a flat cut surface. In addition, part of the protrusions 1159 may have a cut cylindrical shape. Moreover, another part of the protrusions 1159 may have a cut conical shape.

Besides, the protrusions 1159 may include different heights. Specifically, the protrusions 1159 may have heights of less than 2 µm, and may preferably include different heights of less than 1 µm.

In addition, in the case of a vertical semiconductor light-emitting diode as shown in FIGS. 10 through 13B to be described above, an undoped semiconductor layer 1158 may be etched to form an ohmic contact in order to form a second conductive electrode 1152 that forms an electrical coupling to the second conductive semiconductor layer 1153.

As illustrated in FIGS. 14A through 14E described above, the display device 1000 of the present disclosure may be fabricated by a mechanical lift-off method, thereby minimizing damage to the semiconductor light-emitting diode due to heat by laser or chemicals generated when the semiconductor light-emitting diode is separated by a laser lift-off method or a chemical lift-off method. In addition, since the semiconductor light-emitting diode can be separated by physical energy without an additional facility, the process cost may be reduced. As a result, the manufacturing cost may be reduced.

In addition, when the display device is fabricated in a manner of separating the semiconductor light-emitting diode by physical energy, a thickness of the semiconductor light-emitting diode may be formed to be less than 10 µm. It may be a thickness reduced by 50% or more as compared to a semiconductor light-emitting diode fabricated by a laser lift-off method or a chemical lift-off method. In other words, the semiconductor light-emitting diode of the display device fabricated by a mechanical lift off method has an advantage of reducing the thickness. As the thickness of the semiconductor light-emitting diode is reduced, loss of light emitted and emitted from an inside of the semiconductor light-emitting diode may be decreased, thereby increasing the light efficiency.

Meanwhile, the semiconductor light-emitting diode applied to the display device described above may be modified into various forms. These modified examples will be described in the following description.

Figure 15:
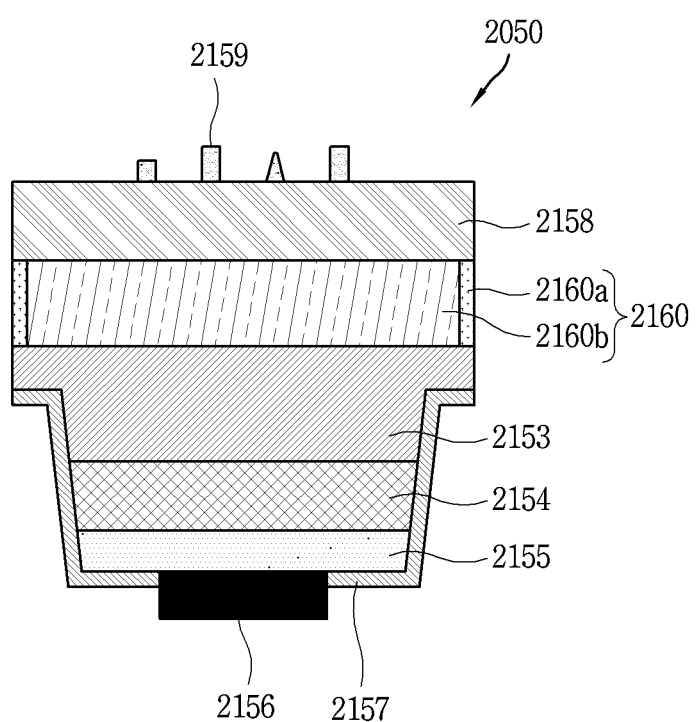
FIG. 15 is a conceptual view showing still another vertical semiconductor light-emitting diode in a display device having a new structure of the present disclosure.

FIG. 15 is a conceptual view showing still another vertical semiconductor light-emitting diode 2050 in a display device having a new structure of the present disclosure.

Referring to FIG. 15, an intermediate layer 2160 is provided between a second conductive semiconductor layer 2153 and an undoped semiconductor layer 2158. In detail, the intermediate layer 2160 is formed of a second conductive semiconductor, and may include aluminum (Al). Preferably, the intermediate layer 2160 may be formed of AlGaN, and an aluminum composition ratio of the intermediate layer 2160 may be below 50%. In addition, a thickness range of the intermediate layer may preferably be formed in a range of 0.1 to 3 µm. Also provided are at least one protrusion 2159, an active layer 2154, a first conductive semiconductor layer 2155, a passivation layer 2157 and a first conductive electrode 2156.

Moreover, a surface of the intermediate layer 2160 may be oxidized by oxygen to form an aluminum oxide layer 2160b, and an intermediate layer 2160a may be formed inside the aluminum oxide layer 2160b.

Figure 16:
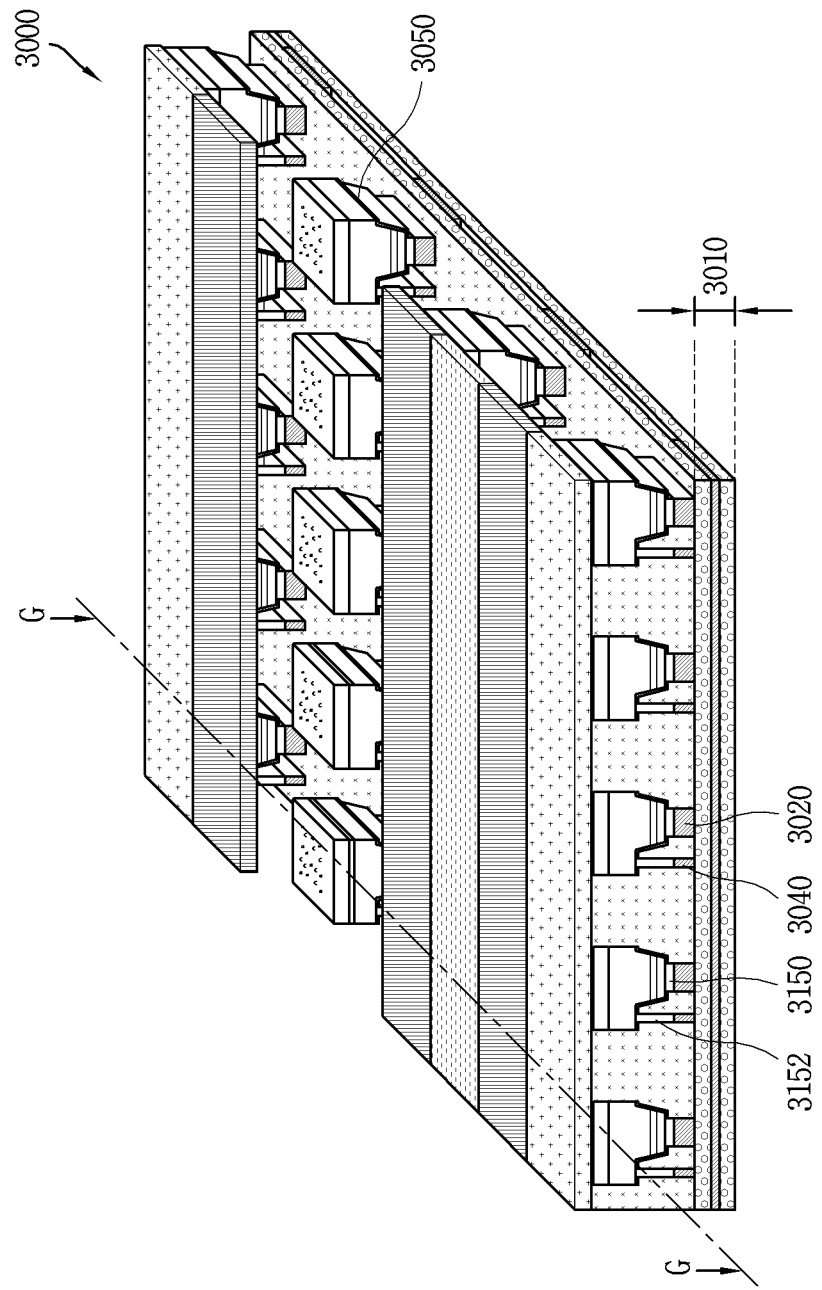
FIG. 16 is an enlarged view of portion "A" in FIG. 1 for explaining still another embodiment of the present disclosure to which a display device having a new structure is applied.
Figure 17:
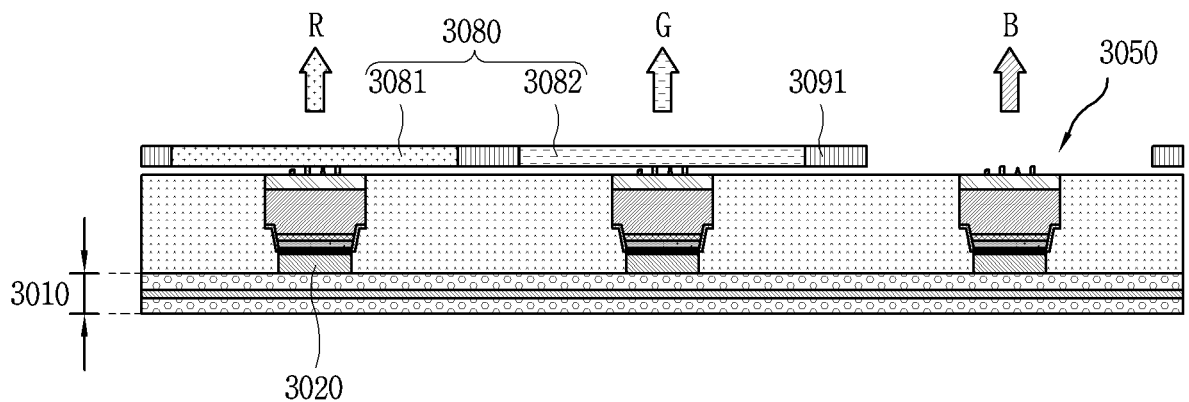
FIG. 17 is a cross-sectional view taken along line G-G in FIG. 16.

FIG. 16 is an enlarged view of portion "A" in FIG. 1 for explaining still another embodiment of the present disclosure of a display device 3000 having a new structure. FIG. 17 is a cross-sectional view taken along line G-G in FIG. 16, and FIG. 18 is a conceptual view showing a flip-chip type semiconductor light-emitting diode 3050 in FIG. 16.

Figure 18:
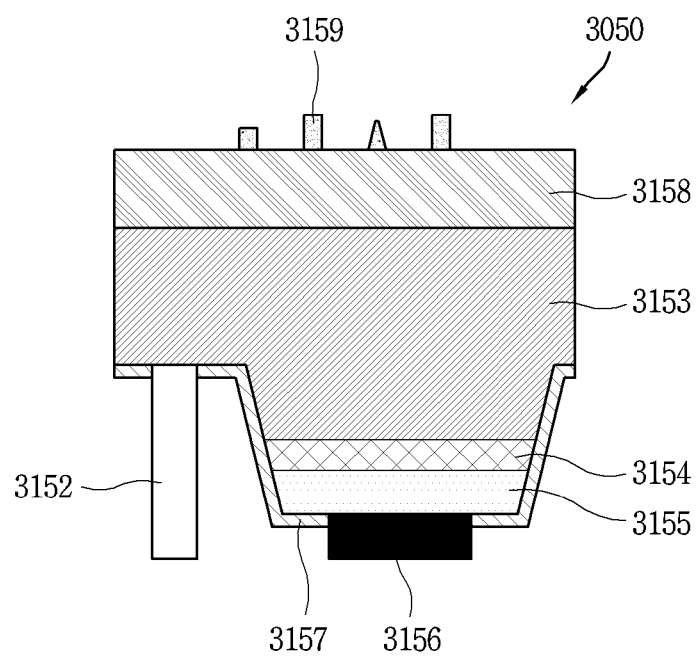
FIG. 18 is a conceptual view showing a flip-chip type semiconductor light-emitting diode in FIG. 16.

Referring to FIGS. 16 through 18, the semiconductor light-emitting diode 3050 in the display device 3000 of the present disclosure may be formed in a flip chip type and assembled on a substrate 3010. The flip chip type semiconductor light-emitting diode 3050 may omit an etching process of the undoped semiconductor layer 3158 deposited on one surface of the second conductive semiconductor layer 3153 to form a second conductive electrode 3152. Also provided are a phosphor layer 3080 including at least a red phosphor layer 3081 and a green phosphor layer 3082, a black matrix 3091. The semiconductor light-emitting diode 3050 can further include at least one protrusion 3159, an active layer 3154, a first conductive semiconductor layer 3155, and a passivation layer 3157.

As a result, the first conductive electrode 3156 and the second conductive electrode 3152 may be electrically connected to a first electrode 3020 and a second electrode 3040, respectively, disposed on the substrate 3010.

Figure 19:
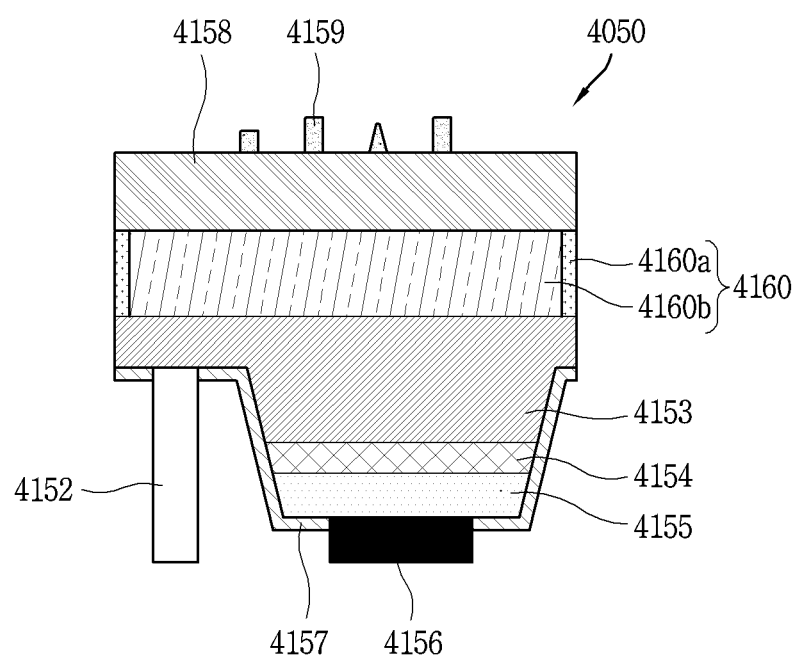
FIG. 19 is a conceptual view showing of another flip-chip type semiconductor light-emitting diode in a display device having a new structure of the present disclosure.

FIG. 19 is a conceptual view showing of another flip-chip type semiconductor light-emitting diode in a display device having a new structure of the present disclosure.

Referring to FIG. 19, an intermediate layer 4160 is provided between a second conductive semiconductor layer 4153 and an undoped semiconductor layer 4158. In detail, the intermediate layer 4160 is formed of a second conductive semiconductor, and may include aluminum (Al). Preferably, the intermediate layer 4160 may be formed of AlGaN, and an aluminum composition ratio of the intermediate layer 4160 may be below 50%. In addition, a thickness range of the intermediate layer may preferably be formed in a range of 0.1 to 3 μm. Provided in a flip chip type semiconductor light-emitting diode 4050 is at least one protrusion 4159, an active layer 4154, a first conductive semiconductor layer 4155, a second conductive electrode 4152, a passivation layer 4157, and a first conductive electrode 4156.

Moreover, a surface of the intermediate layer 4160 may be oxidized by oxygen to form an aluminum oxide layer 4160b, and an intermediate layer 4160a may be formed inside the aluminum oxide layer 4160b.

The configurations and methods according to the above-described embodiments will not be applicable in a limited way to a display device using the foregoing semiconductor light-emitting diode, and all or part of each embodiment may be selectively combined and configured to make various modifications thereto.

What is claimed is:

1. A display device comprising:
a plurality of semiconductor light-emitting diodes,
wherein at least one of the plurality of semiconductor light-emitting diodes comprises:
a first conductive electrode and a second conductive electrode;
a first conductive semiconductor layer on which the first conductive electrode is disposed;
a second conductive semiconductor layer that overlaps with the first conductive semiconductor layer, and the second conductive electrode being disposed on the second conductive semiconductor layer;
an active layer disposed between the first conductive semiconductor layer and the second conductive semiconductor layer;
an undoped semiconductor layer disposed on the second conductive semiconductor layer; and
protrusions formed of a porous material allowing electropolishing, and on the undoped semiconductor layer,
wherein a surface on the undoped semiconductor layer has a first region, and a second region that is disposed inward of the first region,
wherein the second region contains the protrusions, and
wherein a surface roughness of the second region is greater than that of the first region.

2. The display device of claim 1, wherein the protrusions are formed of a second conductive semiconductor, and have a higher impurity concentration than the second conductive semiconductor layer.

3. The display device of claim 1, wherein the at least one of the plurality of semiconductor light-emitting diodes further comprises:
an intermediate layer between the second conductive semiconductor layer and the undoped semiconductor layer,
wherein the intermediate layer is formed of a second conductive semiconductor, and contains aluminum (Al).

4. The display device of claim 3, wherein the at least one of the plurality of semiconductor light-emitting diodes further comprises:
an oxide layer covering a side surface of the intermediate layer, and
wherein the oxide layer comprises an aluminum oxide layer (AlxOy).

5. The display device of claim 1, wherein the at least one of the plurality of semiconductor light-emitting diodes further comprises:
a passivation layer covering at least part of side surfaces of the first conductive semiconductor layer, the second conductive semiconductor layer, and the active layer.

6. The display device of claim 1, wherein the protrusions formed have different heights of less than 2 μm.

7. A method of manufacturing a display device, the method comprising:
a thin layer forming operation of sequentially growing a conductive layer, a protective layer, a sacrificial layer, an undoped semiconductor layer, a second conductive semiconductor layer, an active layer and a first conductive semiconductor layer on a growth substrate;
a first isolation operation of etching at least part of the first conductive semiconductor layer, the active layer, and the second conductive semiconductor layer to form a passivation layer;
a second isolation operation of dry etching at least part of the passivation layer, the second conductive semiconductor layer, the undoped semiconductor layer, the sacrificial layer, and the protective layer;
an electropolishing operation of electrochemically etching the sacrificial layer to form a porous structure; and
a mechanical lift-off operation of cutting the porous structure to form protrusions,
wherein the protective layer contains aluminum (Al),
wherein the sacrificial layer is formed of a second conductive semiconductor, and has a higher impurity concentration than the second conductive semiconductor layer, and
wherein a reaction gas of dry etching in the second isolation step contains oxygen.

8. The method of claim 7, wherein an aluminum composition ratio of the protective layer is less than 50%.

9. The method of claim 7, wherein the protective layer is formed of a plurality of layers containing AlGaN and GaN, and
wherein at least one layer thereof contains second conductive impurities.

10. The method of claim 7, wherein an oxide layer covering a side surface of the protective layer is formed in the second isolation operation, and
wherein the oxide layer comprises an aluminum oxide layer (AlxOy).

11. The method of claim 7, further comprising:
an intermediate layer between the second conductive semiconductor layer and the undoped semiconductor layer, wherein the intermediate layer is formed of a second conductive semiconductor, and contains aluminum (Al).

12. The method of claim 11, wherein an aluminum composition ratio of the intermediate layer is less than 50%.

13. The method of claim 11, wherein an oxide layer covering a side surface of the intermediate layer is formed in the second isolation operation, and
wherein the oxide layer comprises an aluminum oxide layer (AlxOy).

14. The method of claim 7, further comprising:
an electrode forming operation of forming a first conductive electrode and a second conductive electrode corresponding to the first conductive semiconductor layer and the second conductive semiconductor layer, respectively.

15. The method of claim 14, comprising:
etching the undoped semiconductor layer prior to forming the second conductive electrode.

16. The method of claim 7, wherein the protrusions formed have different heights of less than 2 μm.

17. The method of claim 7, wherein the electropolishing operation further forms a surface on the sacrificial layer having a first region, and a second region that is disposed inward of the first region,
wherein the second region contains the protrusions, and
wherein a surface roughness of the second region is greater than that of the first region.

18. A display device comprising:
a plurality of semiconductor light-emitting diodes,
wherein at least one of the plurality of semiconductor light-emitting diodes comprises:
a first conductive semiconductor layer, a second conductive semiconductor layer, and an active layer interposed between the first conductive semiconductor layer and the second conductive semiconductor layer; and
an undoped semiconductor layer disposed on the second conductive semiconductor layer, the undoped semiconductor layer having a surface with a first region and a second region that is disposed inward of the first region,
wherein the second region contains protrusions, and
wherein a surface roughness of the second region is greater than that of the first region.

19. The display device of claim 18,
wherein the protrusions in the second region have different heights of less than 2 μm.

* * * * *